(12) United States Patent
Ueno et al.

(10) Patent No.: US 8,076,690 B2
(45) Date of Patent: Dec. 13, 2011

(54) SEMICONDUCTOR LIGHT EMITTING APPARATUS HAVING A NON-LIGHT EMITTING CORNER AREA

(75) Inventors: Kazuhiko Ueno, Tokyo (JP); Takashi Ebisutani, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 289 days.

(21) Appl. No.: 12/573,397

(22) Filed: Oct. 5, 2009

(65) Prior Publication Data

US 2010/0084675 A1 Apr. 8, 2010

(30) Foreign Application Priority Data

Oct. 3, 2008 (JP) .................................. 2008-258284

(51) Int. Cl.

| H01L 29/22 | (2006.01) |
|---|---|
| H01L 29/227 | (2006.01) |
| H01L 33/00 | (2006.01) |
| H01L 29/24 | (2006.01) |
| H01L 27/15 | (2006.01) |
| H01L 29/26 | (2006.01) |
| H01L 31/12 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl. ................ 257/98; 257/13; 257/79; 257/94; 257/100; 257/E33.001; 257/E33.002; 257/E33.005; 257/E33.006; 257/E33.059; 257/E33.067; 257/E33.068; 257/E33.073

(58) Field of Classification Search .................... 257/13, 257/79, 94, 98, 100, E33.001, E33.002, E33.005, 257/E33.006, E33.059, E33.067, E33.068, 257/E33.073

See application file for complete search history.

(56) References Cited

U.S. PATENT DOCUMENTS

| 7,372,078 B2 * | 5/2008 | Jang et al. ........................ 257/98 |
| 7,528,403 B1 * | 5/2009 | Borselli et al. .................. 257/25 |
| 7,704,760 B2 * | 4/2010 | Tu et al. ........................... 438/22 |
| 7,981,704 B2 * | 7/2011 | Abe et al. ......................... 438/22 |
| 2009/0011530 A1 * | 1/2009 | Ito et al. ........................... 438/32 |
| 2009/0020772 A1 * | 1/2009 | Chiu et al. ...................... 257/98 |
| 2009/0026475 A1 * | 1/2009 | Yamaguchi et al. ............ 257/98 |
| 2009/0052489 A1 * | 2/2009 | Nomura ..................... 372/49.01 |
| 2009/0278145 A1 * | 11/2009 | Sakai ................................ 257/98 |
| 2009/0315045 A1 * | 12/2009 | Horie ............................... 257/93 |
| 2009/0315050 A1 * | 12/2009 | Lee .................................. 257/98 |
| 2010/0072489 A1 * | 3/2010 | McLaurin et al. .............. 257/88 |
| 2010/0110536 A1 * | 5/2010 | Nashimoto et al. ........ 359/341.5 |

\* cited by examiner

FOREIGN PATENT DOCUMENTS

JP  09-153645 A  6/1997

*Primary Examiner* — Ida M Soward
(74) *Attorney, Agent, or Firm* — Kenealy Vaidya LLP

(57) ABSTRACT

A semiconductor light emitting apparatus for emitting a desired colored light by coating the top surface thereof with a wavelength conversion member prevents the color unevenness from occurring due to the unevenness of the coating thickness of the wavelength conversion member. The semiconductor light emitting apparatus can include a semiconductor layer having a light emitting layer with a light emitting surface having at least one corner area, a supporting substrate configured to support the semiconductor layer, and a wavelength conversion material layer formed on top of the semiconductor layer, the wavelength conversion layer having a thickness thinner from a center portion of the semiconductor layer to an outer peripheral portion. The at least one corner area can include a non-emitting portion where light cannot be projected. The non-emitting portion can be a light shielding portion, a non-light emission portion or a current confined portion.

20 Claims, 9 Drawing Sheets

SEMICONDUCTOR LIGHT EMITTING APPARATUS HAVING A NON-LIGHT EMITTING CORNER AREA

This application claims the priority benefit under 35 U.S.C. §119 of Japanese Patent Application No. 2008-258284 filed on Oct. 3, 2008, which is hereby incorporated in its entirety by reference.

TECHNICAL FIELD

The presently disclosed subject matter relates to a semiconductor light emitting apparatus, and in particular, to a semiconductor light emitting apparatus that can utilize a wavelength converting material such as a phosphor to emit white light wherein unevenness in emission color can be reduced or prevented.

BACKGROUND ART

Light emitting diodes (hereinafter, referred to as "LED") can be used with or incorporated in various devices including a tail light for vehicles, indication lamps or backlighting devices for various display devices and mobile equipment such as cellular phones. The growth in demand for such LED devices is expected to increase in the field of headlights for vehicles, backlights for liquid crystal display devices, general lighting fixtures and the like, in the future. In particular, when an LED is used as a light source for headlights for a vehicle or a general-purpose lighting fixture, it is common for the device to emit white light. It should be noted that the color of light emitted from an LED can be determined in accordance with the magnitude of band gap of a semiconductor layer that is inherent to the semiconductor crystal that is used. Accordingly, the color of light emitted from an LED can be monochrome, such as red, green, blue, or the like. When white light is desired to be obtained from an LED having such light emission characteristics, the following methods can be considered.

One method is to employ a combination of a red LED, a green LED and a blue LED arranged in line and allow them to simultaneously emit respective color light. In this case, however, the resulting light as a whole may appear to have different color dependent on various viewing directions because of the specific directivity for LEDs. In addition, it is difficult to maintain over a long period of time the emission of white light by color mixture of light emitted from three colored LEDs. This is because the colored LEDs have respective temperature dependency or other environmental dependency or different degradation rates.

An other method is to employ a particular color LED such as a blue LED and a wavelength conversion material such as a YAG (yttrium aluminum garnet) phosphor in combination. This type of phosphor can absorb blue light and emit yellow light having a longer wavelength characteristic than that of blue light. When combining the blue LED and the phosphor, a part of the blue light emitted from the blue LED can be converted into yellow light by the phosphor and the other part of the blue light can pass through the layer of the phosphor without any substantial change (i.e., while maintaining the original color of light). The color yellow is a result of the combination of red and green. Accordingly, mixture of yellow light from the phosphor with blue light from the blue LED can produce white light. This method can achieve the production of white light with a single blue LED chip, meaning the configuration can be simple. Furthermore, the light emitting apparatus produced in accordance with this method can achieve reduced cost when compared with the first method in which RGB LEDs are arranged in line.

Japanese Patent Application Laid-Open No. Hei. 9-153645 (JP1997-153645A1) discloses a semiconductor light emitting element. The semiconductor light emitting element is produced by sequentially stacking, on a growth substrate, a buffer layer, an n-type semiconductor layer, a light emitting layer, a p-type semiconductor layer, a contact layer, and an electrode layer. The semiconductor light emitting element further includes a phosphor-containing layer formed on the electrode layer. The phosphor-containing layer can absorb UV light emitted from the light emitting layer and convert it into visible light.

SUMMARY

FIG. 1 shows one typical exemplary method for forming a phosphor-containing layer on a top surface of a semiconductor light emitting element. A base 200 for supporting the semiconductor light emitting element is provided with a cup-like recess 201 formed at the center thereof. Then, the semiconductor light emitting element 100 is mounted on the bottom of the recess 201, and the recess 201 is filled with a transparent resin in which the phosphor is dispersed, thereby the phosphor-containing layer 300 covering the semiconductor light emitting element 100 can be formed.

This method, however, poses problems including color unevenness where the color of emitted light is different at the center just above the light emitting surface of the semiconductor light emitting element from the color at the outer peripheral portion thereof. This color unevenness can be caused by the different light path lengths at the center and at the peripheral portion along which the light passes through the phosphor-containing layer 300. Namely, since the light path length in the phosphor-containing layer 300 is short at the center of the light emitting surface, the amount of light that is projected without being subjected to wavelength conversion by the phosphor can be increased. As a result, the direct light (for example, blue light) from the semiconductor light emitting element can be relatively large at the center of the light emitting surface. On the other hand, since the light path length in the phosphor-containing layer 300 is long at the outer peripheral portion, the amount of light wavelength converted by the phosphor (or yellow light) to be projected can be increased. As a result, the light from the phosphor (for example, yellow) can be relatively large at the outer peripheral portion of the light emitting surface. Accordingly, color unevenness of the emitted light can occur in the configuration illustrated in FIG. 1. This color unevenness may make it difficult for application of the light in headlights for vehicles or for general-purpose lighting fixtures.

Another method for forming a phosphor-containing layer can include coating a top surface of a semiconductor light emitting element with a transparent resin such as an epoxy resin, a silicone resin and the like in which phosphor particles have been dispersed (that is collectively referred to as a "wavelength converting member" hereinafter), by means of a dispenser. In this case, the wavelength conversion member is coated over the top surface of the semiconductor light emitting element so as not to run over the top surface of the element. This configuration can remarkably suppress color unevenness when compared with the configuration of FIG. 1.

The method for coating the top surface of a semiconductor light emitting element with the wavelength conversion member by means of a dispenser, however, has a problem in which the wavelength conversion member cannot sufficiently be spread over the top surface of the semiconductor light emitting element up to the respective corner areas, for example. In this case, the light emitted from the semiconductor light emitting element at the respective corner areas where the wavelength conversion member is not sufficiently applied is not wavelength converted by the phosphor such that the light is composed of blue light with less amount of yellow light. Accordingly, the method for forming a phosphor-containing layer by coating the top surface of a semiconductor light emitting element with a wavelength conversion member has a problem in that color unevenness may occur due to the unevenness of the coating thickness.

The presently disclosed subject matter was devised in view of these and other features, characteristics, and problems and in association with the conventional art. According to an aspect of the presently disclosed subject matter, a semiconductor light emitting apparatus for emitting a desired colored light by coating the top surface thereof with a wavelength conversion member can be configured to prevent color unevenness from occurring due to the unevenness of the coating thickness of the wavelength conversion member.

According to another aspect of the presently disclosed subject matter, a semiconductor light emitting apparatus can include: a semiconductor layer having a light emitting layer with a light emitting surface having at least one corner area; a supporting substrate configured to support the semiconductor layer; and a wavelength conversion material layer formed on top of the semiconductor layer, the wavelength conversion layer having a thickness thinner from a center portion of the semiconductor layer to an outer peripheral portion, wherein the at least one corner area includes a non-emitting portion where light cannot be projected.

In the above configuration of the semiconductor light emitting apparatus, the wavelength conversion material layer can be formed by applying a wavelength conversion member to a top surface of the semiconductor layer, the wavelength conversion member comprising a transparent resin and a phosphor (a wavelength conversion material), and curing the wavelength conversion member.

In the above configuration of the semiconductor light emitting apparatus, the non-emitting portion can be composed of a light shielding portion configured to shield the light emitted from the light emitting layer. The light shielding portion can be composed of a metal film formed on the surface of the semiconductor layer.

Alternatively, the non-emitting portion can be composed of a non-light emission portion formed by removing the light emission layer in part.

Still alternatively, the non-emitting portion can be composed of a current confined portion configured to prevent a current from flowing through the light emitting layer at the at least one corner area. In this case, the current confined portion can be composed of an insulation film formed between the support substrate and the semiconductor layer. In the above configuration of the semiconductor light emitting apparatus, the non-emission portion can be arranged along at least one outer edge portion of the semiconductor layer.

In the above configuration of the semiconductor light emitting apparatus, the semiconductor layer has a rectangular shape having corner areas, and the non-emission portion can be arranged at least one corner area of the semiconductor layer.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

Figure 1:
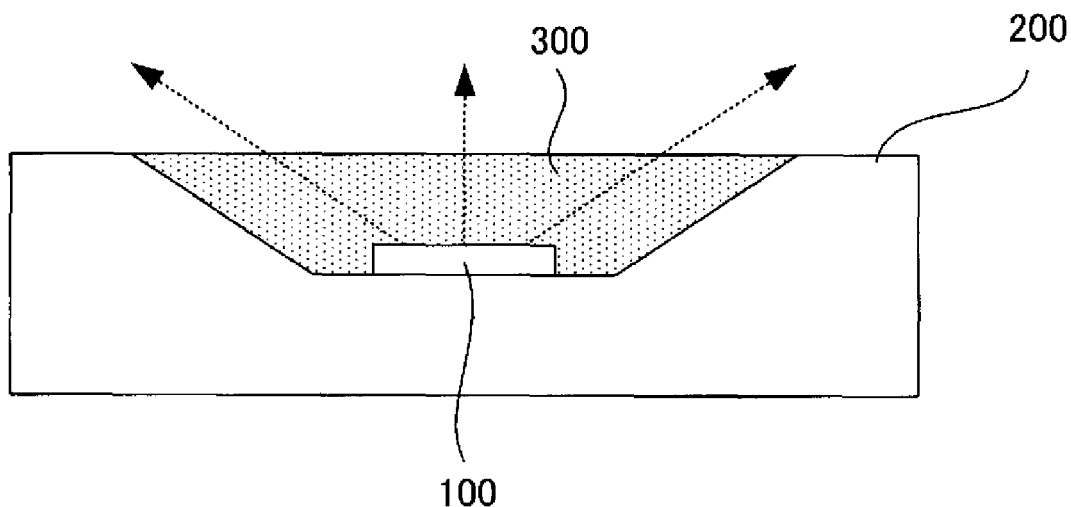
FIG. 1 is a cross-sectional view showing the configuration of a conventional semiconductor light emitting apparatus.

A description will now be made below to exemplary embodiments of semiconductor light emitting apparatuses of the presently disclosed subject matter with reference to the accompanying drawings. It should be noted that the same or similar components shall be denoted by the same reference numerals in the description.

Figure 2A:
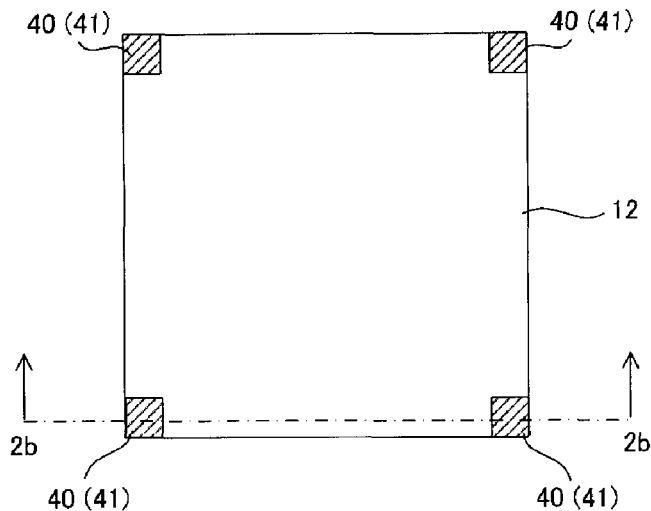
FIG. 2A is a top plan view of a semiconductor light emitting apparatus of a first exemplary embodiment made in accordance with principles of the presently disclosed subject matter.
Figure 2B:
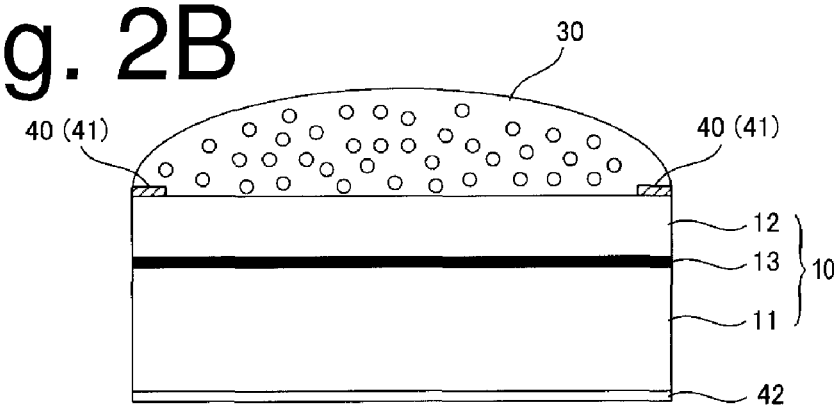
FIG. 2B is a cross-sectional view taken along line 2b-2b in FIG. 2A.
Figure 2C:
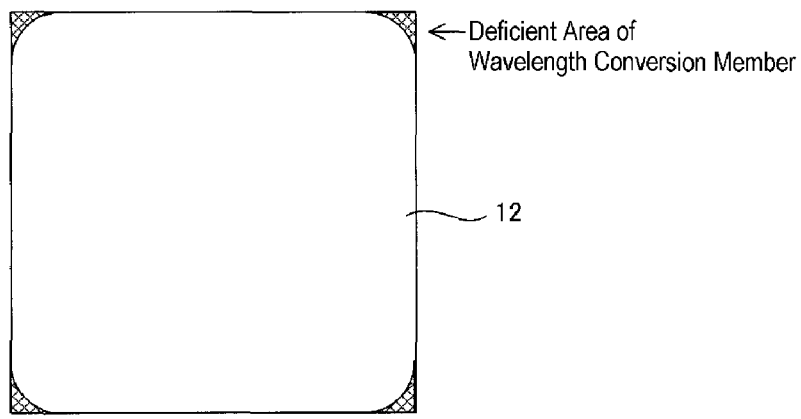
FIG. 2C is a top plan view illustrating a deficient area of a wavelength conversion member.

FIG. 2A is a top plan view of a semiconductor light emitting apparatus of a first exemplary embodiment made in accordance with principles of the presently disclosed subject matter, FIG. 2B is a cross-sectional view taken along line 2b-2b in FIG. 2A, and FIG. 2C is a top plan view illustrating a thin portion of a phosphor-containing layer formed on top of the semiconductor light emitting device, namely illustrating a deficient area of a wavelength conversion member. It should be noted that the phosphor-containing layer is omitted in FIGS. 2A and 2C for facilitating understanding.

The semiconductor light emitting apparatus can be configured to mainly include a support substrate 11, a semiconductor layer 12 formed on the support substrate 11, and a phosphor-containing layer 30 formed of a wavelength conversion member covering the top surface of the semiconductor layer 12. In the present exemplary embodiment, the semiconductor light emitting layer (semiconductor layer) 12 can emit blue light, for example. The wavelength conversion member can absorb blue light to emit a yellow light that is complementary to the color of blue, for example. In the above configuration of the presently disclosed subject matter, the semiconductor layer 12 can have light shielding portions 40 arranged at respective corner areas on the semiconductor layer 12, and configured for shielding light emitted from the light emitting layer of the semiconductor layer 12. In this exemplary embodiment, the light shielding portion 40 can serve as a non-emitting portion. It should be noted that the support substrate 11 and the semiconductor layer 12 formed on the support substrate 11 can function as the semiconductor light emitting element as a whole.

The support substrate 11 can be an Si or Ge semiconductor substrate having a thickness of 100 µm. The support substrate 11 can support the semiconductor layer 12 and can form a current path for performing a current injection into the light emitting layer inside the semiconductor layer 12. The support substrate 11 can be opaque to the light emitted from the light emitting layer of the semiconductor layer 12. Accordingly, the light can be prevented from exiting from the rear surface and the side surface of the support substrate 11.

A metal layer 13 can be interposed between the support substrate 11 and the semiconductor layer 12. The metal layer 13 can be composed of stacked metal films including AuSn soldering materials to bond the support substrate 11 to the semiconductor layer 12. The metal layer 13 can function as a reflector layer in addition to the bonding layer for the support substrate 11 and the semiconductor layer 12.

A rear electrode 42 including Pt or the like can be formed on the rear surface of the support substrate 11.

The semiconductor layer 12 can be composed of a rectangular stacked structure which can be prepared by sequentially stacking an n-type semiconductor layer, a light emitting layer, a p-type semiconductor layer, and other layers, if required. The n-type semiconductor layer can be composed of an n-type GaN layer doped with Si, for example. The light emitting layer can have a multi-quantum well structure formed of InGaN/GaN. The p-type semiconductor layer can be composed of a p-type GaN layer doped with Mg, for example. The light emitting layer of the semiconductor layer 12 having such a structure can emit blue light, for example, having a peak wavelength of approximately 460 nm.

An electrode pad 41 can be formed, for example, of Au, Ag or Al and arranged on the semiconductor layer 12.

The support substrate 11 and the semiconductor layer 12 together constituting the semiconductor light emitting element can be formed in a rectangular shape when viewed from above, for example, with the size of approximately 1 mm×1 mm.

The phosphor-containing layer 30 can be formed of a wavelength conversion member prepared by dispersing a phosphor in a transparent resin such as an epoxy resin or silicone resin. Examples of the phosphor being a wavelength conversion material include YAG:Ce phosphor in which Ce is introduced into YAG as an activating agent. In the present exemplary embodiment, the phosphor can absorb the blue light emitted from the light emitting layer and having a peak wavelength of approximately 460 nm to wavelength convert it into yellow light having an emission peak of approximately 560 nm. Accordingly, the semiconductor light emitting apparatus can emit white light from the light emitting surface, the white light being produced by mixing the yellow light from the phosphor with the original blue light without wavelength converted but passing through the phosphor-containing layer 30. It should be noted that the color combination is not limited to this exemplary embodiment, and the presently disclosed subject matter can employ various combinations of color achieved by various combinations of semiconductor light emitting elements and wavelength conversion materials.

A description will now be given of the method for forming the phosphor-containing layer 30. For example, a gel-like wavelength conversion member is dropped on the top surface of the semiconductor layer 12 and cured to form the phosphor-containing layer 30. The wavelength conversion member can be dropped on the top surface of the semiconductor layer 12 by allowing a nozzle of a dispenser to scan over the top surface within the outer edges of the semiconductor layer 12 so as not to run over the element. The formed phosphor-containing layer 30 can take a dome shape having the topmost portion positioned just above the center of the rectangular semiconductor layer 12. This means that the thickness at the peripheral portion of the semiconductor layer 12 is thinner than the center portion. Namely, the phosphor-containing layer 30 can include an inclined surface (convex curved surface) having an approximately curved cross section from the center of the semiconductor light emitting element 10 to the outer edge downward. For example, the phosphor-containing layer 30 can have a film thickness of approximately 300 µm at (above) the center of the semiconductor layer 12. In this case, for example, the phosphor-containing layer 30 can be formed on the semiconductor layer 12 by a contact angle of approximately 68°. Herein, the "contact angle" shall mean the angle at which a liquid/vapor interface meets a solid surface, in particular, an angle formed by a surface of the semiconductor layer and a tangent of the phosphor-containing layer from the contact point between the semiconductor layer and the phosphor-containing layer on the phosphor-containing layer side. With the phosphor-containing layer 30 having such a structure, it is possible to provide a front luminous intensity distribution having a sharp difference at the interface between the light emitting portion of the semiconductor light emitting apparatus and the outer environment. Accordingly, the semiconductor light emitting apparatus of the presently disclosed subject matter can be applied to lighting fixtures that are designed to provide a front luminous intensity distribution having a sharp difference at the interface between the light emitting portion and the outer environment (such as a vehicle headlight, street lamp, or general lighting fixture).

The phosphor-containing layer 30 can cover only the top surface of the semiconductor layer 12, while not covering the side surface thereof. If the phosphor-containing layer 30 covers the side surface of the semiconductor layer 12, as in the conventional art, light containing much yellow light may be emitted from the peripheral sides of the semiconductor layer 12, resulting in remarkable color unevenness. Accordingly, when the phosphor-containing layer 30 is formed on the semiconductor layer 12, the wavelength conversion member can be strictly controlled in the coating amount or the like so as not to run over the top surface of the semiconductor layer 12. However, if the coating amount is limited for the wavelength conversion member such that it does not run over the top surface of the semiconductor layer 12, the wavelength conversion member may not be evenly and sufficiently spread over the ends of the respective corner areas of the top surface of the semiconductor layer 12, so that a thick area and a thin area of the phosphor-containing layer 30 co-exist. The thin area can be considered a deficient area of the wavelength conversion member. The light emitted from the semiconductor layer 12 through the deficient area of the wavelength conversion member can include little yellow light by the phosphor. Accordingly, the direct blue light from the semiconductor light emitting element at the deficient area can be mainly recognized by viewers, leading to the occurrence of color unevenness. It should be noted that the thickness of the phosphor-containing layer 30 at the deficient area may be approximately 75 µm or less when a typical coating amount for the member is used. Namely, the thickness thereof may be approximately one fourth or lower than the thickness of the phosphor-containing layer at the topmost portion. In the present exemplary embodiment, light shielding portions 40 can be provided at respective corner areas on the top surface of the semiconductor layer 12 including the deficient areas of the wavelength conversion member so that any direct blue light emitted from the semiconductor layer 12 at the corner areas can be shielded by the light shielding portions 40 so that the color unevenness problem can be solved.

The light shielding portion 40 can be formed of a thin metal film, such as gold, on the semiconductor layer 12 and can have a rectangular shape with one side being 150 µm along the corner areas of the semiconductor layer 12. This configuration can allow the light shielding portions 40 to cover the area where the thickness of the phosphor-containing layer 30 is approximately 80 µm or less, and in particular, to completely cover the area where the thickness of the phosphor-containing layer 30 is approximately 75 µm or less so that color unevenness can be prevented.

In this instance, the phosphor-containing layer 30 can be formed on the semiconductor layer 12 at a contact angle ranging from 20° to 90°. This range is effective because a sharp front luminous intensity distribution can be obtained. Namely, when the phosphor-containing layer 30 is formed on the rectangular semiconductor layer 12, there are thin areas of the phosphor-containing layer 30 at respective corner areas which can generate a deficient area of the wavelength conversion member. When the phosphor-containing layer 30 is formed on the rectangular semiconductor layer 12 (with the corner apex angle of 90°) at a constant contact angle, the deficient area of the wavelength conversion member can be formed from the respective corner areas within a certain range of the top surface and does not depend on the area of the semiconductor light emitting element. It is believed that the wavelength conversion member containing the phosphor is dropped over the semiconductor light emitting element by scanning the surface thereof using a nozzle of a dispenser so that the wavelength conversion member is spread over the ends of the semiconductor light emitting element irrespective of the size of the semiconductor light emitting element. Accordingly, the phosphor-containing layer 30 can be formed on the rectangular semiconductor layer 12 with the contact angle ranging from 20° to 90° irrespective of the chip size of the semiconductor light emitting element. In this case, since the light shielding portions 40 with one side being 120 µm or more can be arranged at the respective corner areas, the color unevenness can be suppressed or prevented.

The light shielding portion 40 can be arranged above the light emitting layer in the forward direction of light projection. For example, the light shielding portion 40 can be formed by depositing a metal film on the semiconductor layer 12 and patterning the metal film. The metal film may be any metal material having a low reflectivity so long as the metal film can shield the light emitted from the light emitting layer. Examples of the metal material include Au, Ag, Al and the like.

When the light shielding portion 40 is formed of a metal film on the outermost surface of the semiconductor layer 12, part or all of the light shielding portion 40 can also serve as an electrode pad in accordance with the package configuration. The light shielding portions 40 arranged at the respective corner areas of the semiconductor layer 12 may take different shapes or sizes. For example, one or more light shielding portions 40 also serving as an electrode pad can be formed to have a larger size when compared with the other light shielding portion 40.

The light shielding portion 40 having a relatively larger area may cause light utilization efficiency to deteriorate. Accordingly, the light shielding portion 40 should be formed with the minimum size that can solve or address the problem of color unevenness. Accordingly, the light shielding portions 40 can be formed of rectangular metal films with one side being 150 µm or more along the corner areas of the semiconductor layer 12 and arranged on respective corner areas of the top surface of the rectangular semiconductor layer 12 irrespective of the chip size of the semiconductor light emitting element. This configuration can prevent and/or solve the color unevenness issues. However, in order to reduce the deterioration of light utilization efficiency at the same time when suppressing the color unevenness, the light shielding portions 40 can be formed of rectangular metal films with a first side being 120 µm or more and arranged on the respective corner areas of the top surface of the rectangular semiconductor layer 12. Alternatively, the first side can be in the range of from 120 µm to 150 µm. It should be noted that the shape of the light shielding portion 40 can, alternative to the rectangle shape, be a triangle shape, an arc shape, a shape corresponding to the deficient area of the wavelength conversion member as shown in FIG. 2C, etc., for example, and can be located along the corner area of the semiconductor layer 12. When the light shielding portion 40 is formed in the rectangle shape along the corner area of the semiconductor layer 12, it can also serve as an electrode pad. When the light shielding portion 40 is formed in the triangle shape or the arc shape corresponding to the deficient area of the wavelength conversion member, the configuration can suppress the deterioration of light utilization efficiency.

Figure 3:
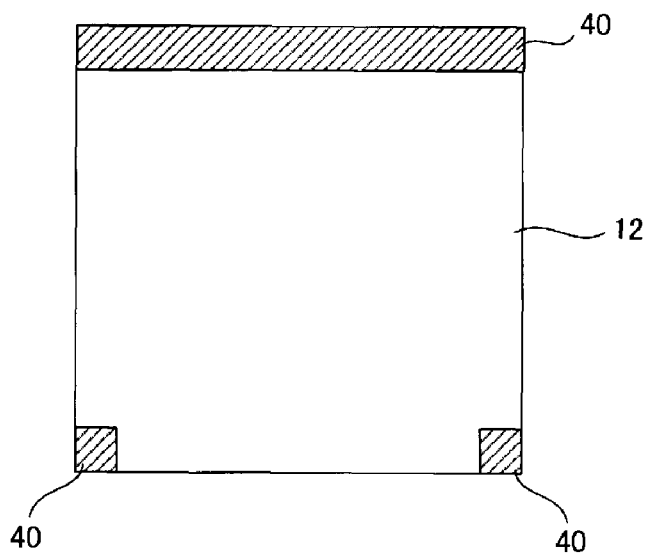
FIG. 3 is a top plan view illustrating a modified example of the first exemplary embodiment of the semiconductor light emitting apparatus of the presently disclosed subject matter.
Figure 4:
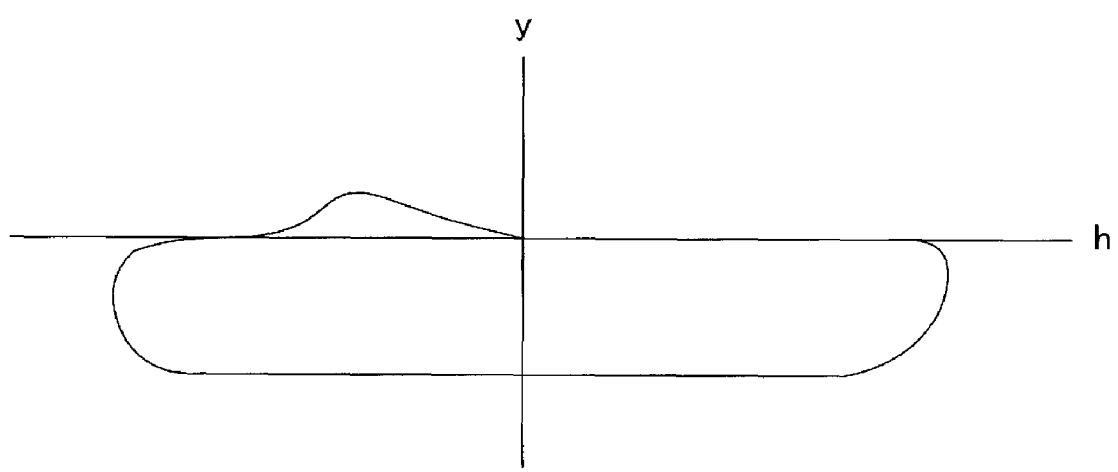
FIG. 4 is a diagram illustrating an ideal light distribution pattern of a headlight for vehicles.

The light shielding portion 40 can be formed not only at the respective corner areas of the top surface of the semiconductor layer 12 but also along one side of the top surface of the semiconductor layer 12 as a linear portion (for example, connecting the adjacent corner areas). When the linear light shielding portion 40 is formed, the light emission shape near the linear light shielding portion 40 can be linear, thereby facilitating the optical design utilizing the linear light distribution. The linear light distribution can preferably be utilized for a vehicle headlight, for example. FIG. 4 shows the ideal light distribution pattern of a vehicle headlight. For example, at least one side of the semiconductor light emitting element is covered with the light shielding portion 40 as shown in FIG. 3 to solve or prevent the problem of color unevenness. At the same time, it is possible to form a bright-dark border line in the horizontal direction coincident with the ideal light distribution pattern.

The light shielding ratio of the light shielding portion 40 (=(1−transmittance)×100) need not be 100%. When the semiconductor light emitting apparatus is used as a vehicle headlight, for example, the light shielding ratio can be set such that color unevenness is resolved to satisfy the product specifications or regulations. The light shielding ratio of the light shielding portion 40 may depend on the means for projecting light emitted from the semiconductor light emitting apparatus to a desired position. For example, a multi reflector can be employed in order to project light from the semiconductor light emitting apparatus as a plurality of light images with the multi reflector having a reflecting surface constituted by a plurality of reflecting regions. The plurality of light images can be overlapped with respect to each other to form the light distribution pattern, for example, as shown in FIG. 4. In this case, the light shielding portion 40 may have a light shielding ratio of about 70%, which is enough for improving the color unevenness of blue light. On the other hand, when the light emitted from the semiconductor light emitting apparatus is projected through a lens serving as an optical system, the blue light emitted from the semiconductor light emitting element at the respective corner areas is projected as it is. In this case, the light shielding portion 40 should have a higher light shielding ratio when compared with the case where the above mentioned plurality of reflecting regions are used. Furthermore, the light shielding portion 40 need not be in contact with the outer periphery of the semiconductor light emitting element, and can be formed slightly inwardly from the periphery. This can be allowed as long as the color unevenness does not become obvious.

As described above, the semiconductor light emitting apparatus of the present exemplary embodiment can be provided with the light shielding portions 40 arranged at respective corner areas of the top surface of the semiconductor layer 12 corresponding to the deficient area of the wavelength conversion member where the wavelength conversion member cannot be sufficiently applied. In this configuration, the thin phosphor-containing layer 30 at the respective corner areas cannot sufficiently wavelength convert the blue light emitted at these areas. However, the light shielding portions 40 can appropriately shield the light emitted at the corner areas so as to efficiently prevent the occurrence of color unevenness.

As in the present exemplary embodiment, the support substrate 11 can be composed of an opaque material. This can eliminate light emission from the side surface of the support substrate 11. This can also prevent the occurrence of color unevenness at these areas, thereby increasing the light amount directed in the forward light projection direction.

Hereinafter, a description will be given of an exemplary production method of a semiconductor light emitting apparatus made in accordance with principles of the presently disclosed subject matter with reference to FIGS. 5A to 5G. FIGS. 5A to 5G are cross-sectional views illustrating the process of the production method of the present semiconductor light emitting apparatus. The description is given of the procedure up to mounting of the semiconductor light emitting apparatus onto the mount substrate.

Figure 5A:
FIGS. 5A to 5G show a method for producing the semiconductor light emitting apparatus of the first exemplary embodiment of the presently disclosed subject matter.

First, a sapphire substrate 50 can be prepared as a growth substrate (FIG. 5A). The sapphire substrate 50 is carried in a MOVPE apparatus so that the substrate 50 is subjected to thermal cleaning.

Next, a semiconductor layer 12 is grown on the sapphire substrate 50 by the Metal-Organic Vapor Phase Epitaxy method (MOVPE method) or the like. Specifically, trimethyl gallium (TMG) and $NH_3$ are supplied into the apparatus to form a buffer layer (not shown) composed of a GaN layer.

Then, TMG, $NH_3$ and $SiH_4$ serving as a dopant gas are supplied into the apparatus to form an n-type semiconductor layer 12a composed of an n-type GaN layer.

Next, a light emitting layer 12b is formed on the n-type semiconductor layer 12a. In the present exemplary embodiment, a multi quantum well structure composed of InGaN/GaN is applied to the light emitting layer 12b. In this case, InGaN/GaN is formed as one cycle and the process is repeated five times (five cycles). Specifically, this structure is achieved by forming an InGaN well layer while supplying TMG, trimethyl indium (TMI) and $NH_3$ and then forming a GaN barrier layer while supplying TMG and $NH_3$, and repeating these sequential processes five times to form the light emitting layer 12b.

Then, TMG, trimethyl aluminum (TMA) and $NH_3$ and bis-cyclopentadienyl Mg ($CP_2Mg$) serving as a dopant are supplied to form a p-type AlGaN cladding layer (not shown).

Figure 5B:
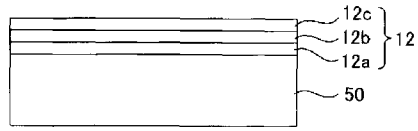

Furthermore, TMG, $NH_3$ and $CP_2Mg$ serving as a dopant are supplied to form a p-type semiconductor layer 12c composed of a p-type GaN layer (FIG. 5B).

Figure 5C:
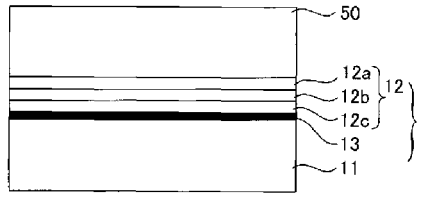

The formed semiconductor layer 12 is bonded to a support substrate 11. The support substrate 11 is a semiconductor substrate such as an Si or Ge substrate opaque with respect to the wavelength of emitted light. The semiconductor layer 12 and the support substrate 11 are bonded together via a metal layer 13. The metal layer 13 is formed by stacking a plurality of metal films including, for example, AuSn soldering materials or the like. The metal layer 13 can function as a light reflecting layer in addition to the bonding layer between the semiconductor layer 12 and the support substrate 11 (FIG. 5C).

Figure 5D:
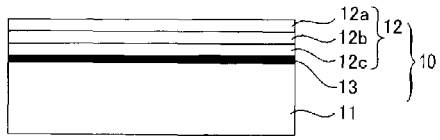

Then, the sapphire substrate 50 is removed from the semiconductor layer 12. The sapphire substrate 50 can be removed by a known method such as a Laser Lift Off (LLO) method or the like. When performing the LLO method, the GaN layer formed on the sapphire substrate 50 is decomposed by the irradiation of laser light into metal Ga and N. After removing the sapphire substrate 50, the n-type semiconductor layer 12a is exposed (FIG. 5D).

Figure 5E:
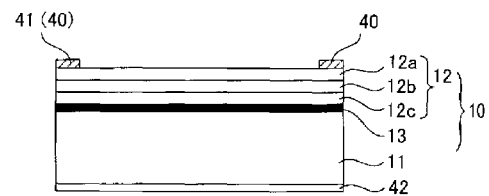

Then, an electrode pad 41 is formed on the top surface of the n-type semiconductor layer 12a that has been exposed by removing the sapphire substrate 50. At the same time, a light shielding portion 40 is formed on the top surface of the n-type semiconductor layer 12a. The light shielding portion 40 and the electrode pad 41 are formed by depositing a metal such as Au, Ag, Al or the like on the n-type semiconductor layer 12a by a sputtering method or the like, and then, patterning the metal by a photolithography technique or the like. The patterning can form the light shielding portions 40 at the respective corner areas of the top surface of the semiconductor layer 12 including the deficient areas of the wavelength conversion member, as shown in FIG. 2C. It should be noted that the light shielding portions 40 at the respective corner areas of the top surface of the semiconductor layer 12 can be utilized as the electrode pad(s) 41. The electrode pad 41 can be formed independently of the light shielding layer 40 on the center area of the top surface of the semiconductor layer 12. In this case, however, a center area would be produced where light cannot be emitted from the semiconductor light emitting element. Accordingly, forming the electrode pad 41 at the peripheral edge area or corner area of the semiconductor layer 12 can allow the center area to freely emit light, and the electrode pad 41 can also be formed in the corner areas in view of the coating workability of the wavelength conversion member on the semiconductor layer 12. Furthermore, a rear electrode 42 can be formed by vapor deposition of a metal such as Pt or the like on the rear surface of the support substrate 11 (FIG. 5E).

Figure 5F:
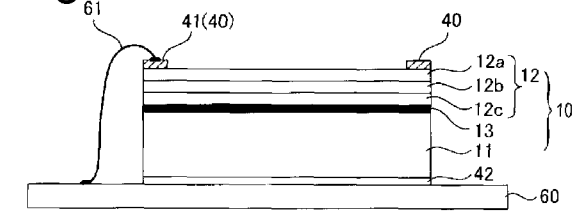

Next, the semiconductor light emitting element 10 including the support substrate 11 and the semiconductor layer 12 formed by the above process is diced into individual chips. Then, the diced semiconductor light emitting element 10 is mounted on a mount substrate 60. The semiconductor light emitting element 10 and the mount substrate 60 can be bonded together by use of AuSn soldering materials or a conductive adhesive such as Ag paste or the like. Then, the electrode pad 41 formed on the top surface of the semiconductor layer 12 is connected to a power supply wiring formed on the mount substrate 60 by a bonding wire 61 (FIG. 5F).

Figure 5G:
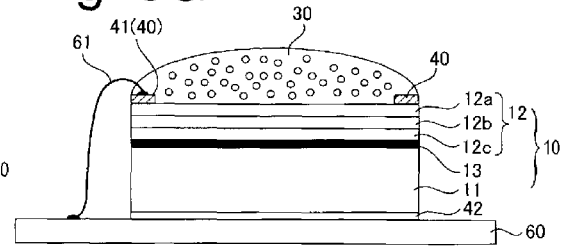

Next, a gel-like wavelength conversion member is coated on the top surface of the semiconductor layer 12 by a dispenser. The wavelength conversion member can be a material that is prepared by dispersing YAG:Ce phosphor into a transparent resin including an epoxy resin or a silicone resin. The wavelength conversion member is applied in a particular coating amount such that the member does not run over the top surface of the semiconductor layer 12. Then, the wavelength conversion member is cured by heat to form a phosphor-containing layer 30 covering the top surface of the semiconductor light emitting element 10. Accordingly, when the wavelength conversion member is coated on the top surface of the semiconductor layer 12 by a dispensing method within a size of approximately 1 mm×1 mm, the phosphor-containing layer 30 is formed to have a dome-shaped (curved) top surface and a maximum thickness of approximately 300 µm. The thickness of the phosphor-containing layer 30 can be thinned to approximately 100 µm by increasing the concentration of the phosphor dispersed in the transparent resin. It should be noted that the phosphor dispersed in the transparent resin may be uniformly distributed or settled in the transparent resin. As a result, the semiconductor light emitting apparatus of the present exemplary embodiment can be completed through the above process (FIG. 5G).

Second Exemplary Embodiment

Figure 6A:
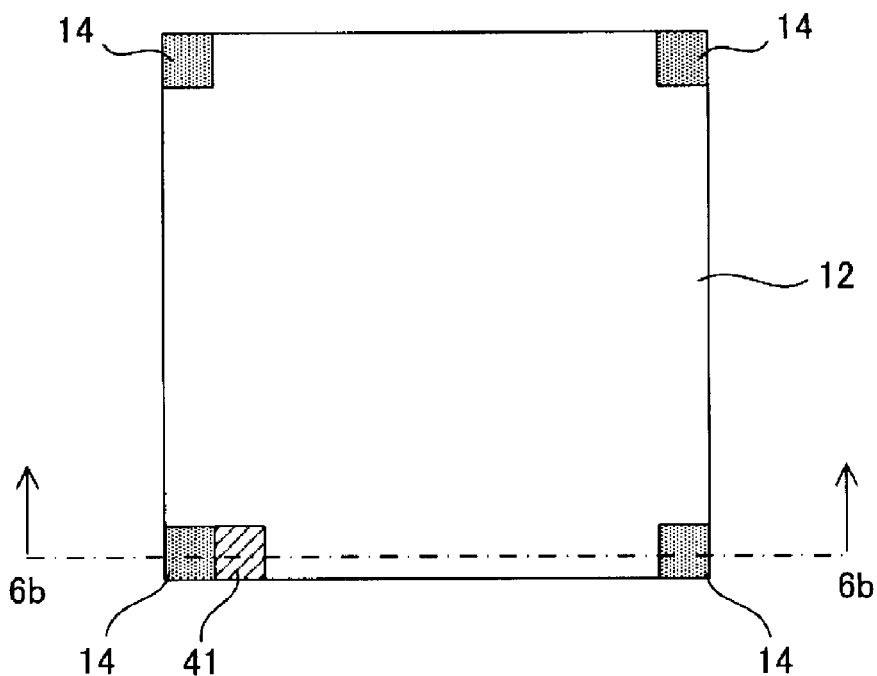
FIG. 6A is a top plan view illustrating a semiconductor light emitting apparatus of a second exemplary embodiment made in accordance with principles of the presently disclosed subject matter.
Figure 6B:
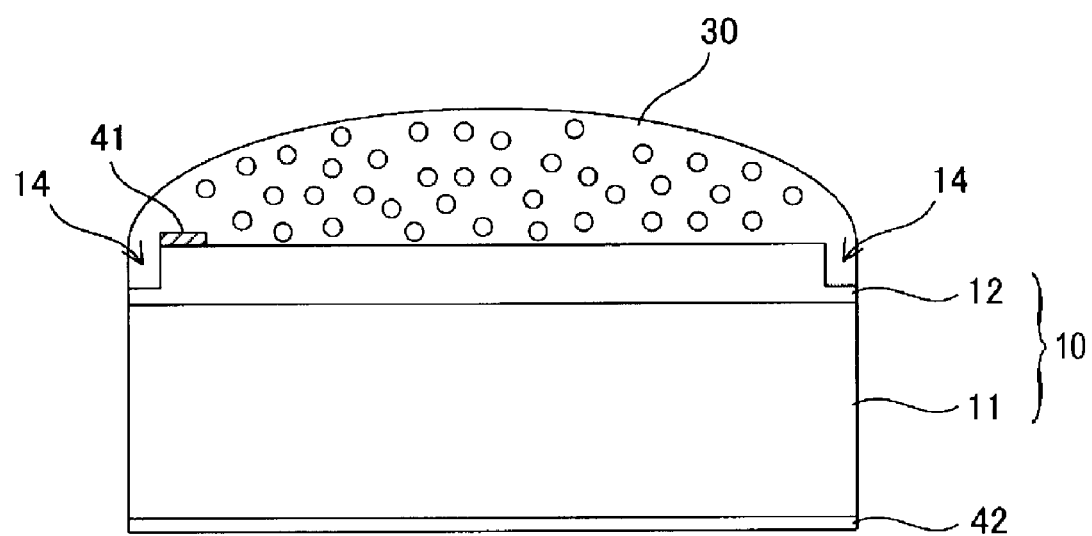
FIG. 6B is a cross-sectional view taken along line 6b-6b in FIG. 6A.

FIG. 6A is a top plan view illustrating the top plan view of the semiconductor light emitting apparatus of a second exemplary embodiment made in accordance with principles of the presently disclosed subject matter, and FIG. 6B is a cross-sectional view taken along line 6b-6b in FIG. 6A. Note that the phosphor-containing layer is omitted in FIG. 6A for facilitating understanding of the subject matter.

The basic configuration of the semiconductor light emitting apparatus of the present exemplary embodiment can be the same as that of the first exemplary embodiment. Specifically, the semiconductor layer 12 including the light emitting layer can be bonded onto the opaque support substrate 11 made of Si or Ge via a metal layer 13. The metal layer 13 can function as a light reflecting layer in addition to the bonding layer for the support substrate 11 and the semiconductor layer 12. The dome-shaped phosphor-containing layer 30 can be formed by dropping a wavelength conversion member that is prepared by dispersing a phosphor in a transparent resin, on the top surface of the semiconductor element 10. An electrode pad 41 is provided on the top surface of the semiconductor layer 12 and a rear electrode 42 is provided on the rear surface of the support substrate 11.

As in the first exemplary embodiment, the semiconductor light emitting apparatus of the present exemplary embodiment can include a deficient area of wavelength conversion member that is formed by unevenly and insufficiently spreading the wavelength conversion member over the ends of the respective corner areas of the top surface of the semiconductor element 10, as shown in FIG. 2C. The light emitted from the semiconductor layer 12 through the deficient area of the wavelength conversion member can include little yellow light from the phosphor. Thus, the direct blue light from the semiconductor light emitting element at the deficient area can be recognized by viewers, leading to the occurrence of color unevenness. In the present exemplary embodiment, non-light emission portions 14 are provided at respective corner portions on the top surface of the semiconductor layer 12 including the deficient areas of the wavelength conversion member so that light cannot be emitted from the semiconductor layer 12 at the corner areas. This configuration can prevent or solve color unevenness problems. The non-emission portion can be formed by removing at least part of the light emitting layer of the semiconductor layer 12.

Light cannot be emitted through the portion where the light emitting layer is removed. Accordingly, this configuration can solve or prevent the problems of blue light emission from the respective corner areas of the semiconductor layer 12 even without light shielding portions. It should be noted that p-type and/or n-type semiconductor layers other than the light emitting layer may remain in the semiconductor layer 12 at the non-light emission portions 14.

The non-light emission portions 14 can have a rectangular shape with one side being 120 µm or more along the corner areas of the semiconductor layer 12 as in the light shielding portion of the first exemplary embodiment, and can have one side being approximately 150 µm, so that the color unevenness can be prevented or solved. It should be noted that the shape of the non-light emission portion 14 can, for example, alternatively or in addition to the rectangular shape, be a triangle shape, an arc shape, a shape corresponding to the deficient area of the wavelength conversion member as shown in FIG. 2C, etc., along the corner area of the semiconductor layer 12. The non-light emission portion 14 can be formed not only at the respective corner areas of the top surface of the semiconductor layer 12 but also along one side of the top surface of the semiconductor layer 12 as a linear portion (for example, connecting the adjacent corner areas).

In the first exemplary embodiment, light shielding portions 40 are provided at the respective corner areas on the semiconductor layer 12 corresponding to the deficient areas of the wavelength conversion member. This configuration can shield the light emitted from the light emitting layer at these areas. Accordingly, this configuration may result in deterioration of light utilization efficiency. In the present exemplary embodiment, however, the non-light emission portions 14 are formed by removing the light emitting layer at the corner areas corresponding to the deficient areas of the wavelength conversion member so as to serve as the structure that can prevent light emission in part. Accordingly, the light utilization efficiency does not deteriorate by the configuration of the second exemplary embodiment.

Hereinafter, a description will be given of the production method of the semiconductor light emitting apparatus of the second exemplary embodiment with reference to FIGS. 7A to 7G. FIGS. 7A to 7G are cross-sectional views illustrating the process of the production method of the present semiconductor light emitting apparatus of the second exemplary embodiment.

Figure 7A:
FIGS. 7A to 7G show a method for producing the semiconductor light emitting apparatus of the second exemplary embodiment of the presently disclosed subject matter.
Figure 7B:
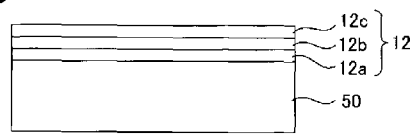

The process of the formation of the semiconductor layer 12 on the sapphire substrate 50 can be the same as those in the first exemplary embodiment, thereby sequentially forming a buffer layer (not shown), an n-type semiconductor layer 12a, a light emitting layer 12b and a p-type semiconductor layer 12c on the sapphire substrate 50 by the MOVPE method or a similar method (FIGS. 7A and 7B).

Figure 7C:
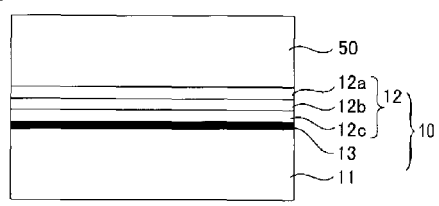
Figure 7D:
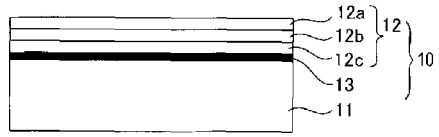

The formed semiconductor layer 12 can be bonded to a support substrate 11. The support substrate 11 is a semiconductor substrate such as an Si or Ge substrate opaque with respect to the wavelength of emitted light. The semiconductor layer 12 and the support substrate 11 are bonded together via a metal layer 13. The metal layer 13 is formed by stacking a plurality of metal films including, for example, AuSn soldering materials or the like (FIG. 7C). Then, the sapphire substrate 50 can be removed from the semiconductor layer 12. The sapphire substrate 50 can be removed by a known method such as the LLO method or the like. When performing the LLO method, the GaN layer formed on the sapphire substrate 50 is decomposed by the irradiation of laser light into metal Ga and N. After removing the sapphire substrate 50, the n-type semiconductor layer 12a is exposed (FIG. 7D).

Figure 7E:
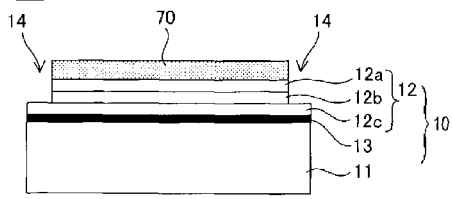

Then, a resist mask 70 is formed on the top surface of the n-type semiconductor layer 12a that has been exposed by removing the sapphire substrate 50. The resist mask 70 is configured to include openings at the respective corner areas corresponding to the area where the non-light emission portions 14 are to be formed. Next, a plasma etching method utilizing a chlorine-type gas is performed to etch the n-type semiconductor layer 12a and the light emitting layer 12b through the resist mask 70, thereby partly removing the semiconductor layer 12 and forming the non-light emission portions 14 at the respective corner areas. It should be noted that the plasma etching technique can use an inductively coupled plasma (ICP) dry etching apparatus, a parallel plate dry etching apparatus, or the like. Furthermore, it should be noted that the p-type semiconductor layer 12c may remain as it is without being etched (FIG. 7E).

Then, metal such as Au, Ag, Al or the like is deposited on the n-type semiconductor layer 12a by a sputtering method or the like, and the metal is patterned by a photolithography technique or the like, thereby forming an electrode pad 41. Furthermore, a rear electrode 42 is formed by vapor deposition of a metal such as Pt or the like on the surface of the support substrate 11.

Figure 7F:
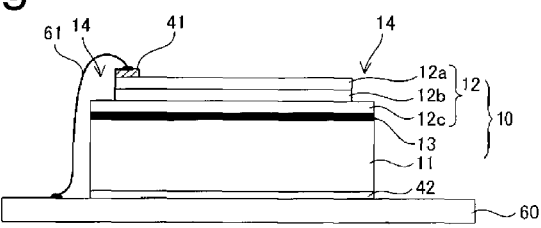

Next, the semiconductor light emitting element 10 including the support substrate 11 and the semiconductor layer 12 formed by the above process is diced into individual chips. Then, the diced semiconductor light emitting element 10 is mounted on a mount substrate 60. The semiconductor light emitting element 10 and the mount substrate 60 can be bonded together by use of AuSn soldering materials or a conductive adhesive such as Ag paste or the like. Then, the electrode pad 41 formed on the top surface of the semiconductor layer 12 is connected to a power supply wiring formed on the mount substrate 60 by a bonding wire 61 (FIG. 7F).

Figure 7G:
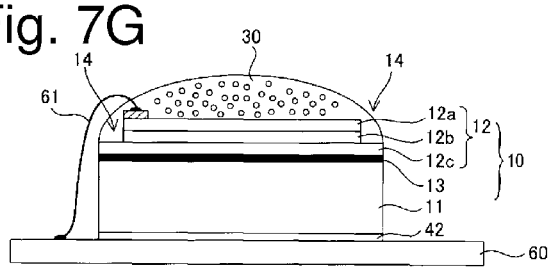

Next, a gel-like wavelength conversion member is coated on the top surface of the semiconductor layer 12 by a dispenser. The wavelength conversion member can be a material that is prepared by dispersing YAG:Ce phosphor into a transparent resin including an epoxy resin or a silicone resin. The wavelength conversion member is applied with an adjusted coating amount such that the member does not run over the top surface of the semiconductor layer 12. Then, the wavelength conversion member is cured by heat to form a phosphor-containing layer 30 covering the top surface of the semiconductor layer 12. It should be noted that the phosphor dispersed in the transparent resin may be uniformly distributed or settled in the transparent resin. As a result, the semiconductor light emitting apparatus of the present exemplary embodiment can be completed through the above described process (FIG. 7G).

It should be noted that in the above exemplary embodiment the non-light emission portions 14 can be formed by etching the n-type semiconductor layer 12a and the light emitting layer 12b after bonding the semiconductor layer 12 to the support substrate 11. However, they can also be formed before bonding the semiconductor layer 12 to the support substrate 11.

Third Exemplary Embodiment

Figure 8:
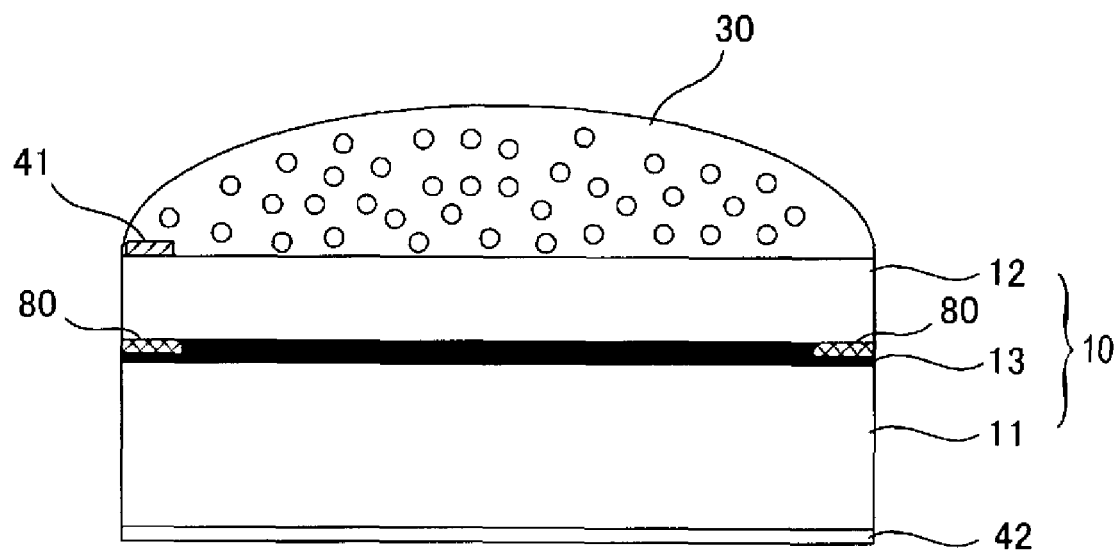
FIG. 8 is a cross-sectional view illustrating a semiconductor light emitting apparatus of a third exemplary embodiment made in accordance with principles of the presently disclosed subject matter.

FIG. 8 shows a cross sectional view of a third exemplary embodiment of a semiconductor light emitting apparatus of the presently disclosed subject matter. The basic configuration of the semiconductor light emitting apparatus of the present exemplary embodiment can be the same as that of the first exemplary embodiment. Specifically, the semiconductor layer 12 including the light emitting layer can be bonded onto the opaque support substrate 11 made of Si or Ge via a metal layer 13. The metal layer 13 can function as a light reflecting layer in addition to the bonding layer for the support substrate 11 and the semiconductor layer 12. The dome-shaped phosphor-containing layer 30 can be formed by dropping a wavelength conversion member that is prepared by dispersing a phosphor in a transparent resin, on the top of the semiconductor element 10. An electrode pad 41 can be provided on the top surface of the semiconductor layer 12 and a rear electrode 42 can be provided on the rear surface of the support substrate 11.

As in the first exemplary embodiment, the semiconductor light emitting apparatus of the present exemplary embodiment can include a deficient area of the wavelength conversion member that is formed by unevenly and insufficiently spreading the wavelength conversion member over the ends of respective corner areas of the top surface of the semiconductor element 10, as shown in FIG. 2C. The light emitted from the semiconductor layer 12 through the deficient area of the wavelength conversion member can include only a small amount of yellow light emitted by the phosphor. Thus, the direct blue light from the semiconductor light emitting element at the deficient area can be recognized by viewers, leading to the occurrence of color unevenness. In the present exemplary embodiment, current confined portions 80 are provided at portions corresponding to the deficient areas of the wavelength conversion member so that light is prevented from being emitted from the semiconductor layer 12 at the corner areas. This configuration can prevent or solve the color unevenness problem. The current confined portions 80 can be configured by forming an insulating film such as $SiO_2$ or the like on at least one of the surface of the semiconductor layer 12 and the surface of the support substrate 11. Current injection to the light emitting layer is blocked at the portions where the current confined portions 80 are formed, thereby forming non-emitting portions. Accordingly, the current confined portions 80 are arranged at respective corner areas of the semiconductor light emitting element corresponding to the deficient areas of the wavelength conversion member. This configuration can prevent the blue light emission at these areas, which is the cause for the color unevenness.

The current confined portions 80 can have a rectangular shape with one side being 120 μm or more along the corner areas of the semiconductor layer 12 as in the light shielding portion of the first exemplary embodiment, and preferably with one side being approximately 150 μm, so that the color unevenness can be solved. It should be noted that the shape of the current confined portion 80 can be, for example, in addition to the rectangle shape, a triangle shape, an arc shape, a shape corresponding to the deficient area of the wavelength conversion member as shown in FIG. 2C, etc., along the corner area of the semiconductor layer 12. The current confined portion 80 can be formed not only at the respective corner areas of the top surface of the semiconductor layer 12 but also along one side of the top surface of the semiconductor layer 12 as a linear portion (for example, connecting the adjacent corner areas).

Hereinafter, a description will be given of the production method of the semiconductor light emitting apparatus of the third exemplary embodiment with reference to FIGS. 9A to 9G. FIGS. 9A to 9G are cross-sectional views illustrating the process of the production method of the present semiconductor light emitting apparatus of the third exemplary embodiment.

The process of the formation of the semiconductor layer 12 on the sapphire substrate 50 can be the same as those in the first exemplary embodiment, thereby sequentially forming a buffer layer (not shown), an n-type semiconductor layer 12a, a light emitting layer 12b and a p-type semiconductor layer 12c on the sapphire substrate 50 by the MOVPE method or a similar method.

Figure 9A:
FIGS. 9A to 9G show a method for producing the semiconductor light emitting apparatus of the third exemplary embodiment of the presently disclosed subject matter.
Figure 9B:
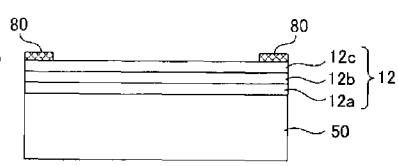

On the formed p-type semiconductor layer 12c, an insulating film such as SiO$_2$ or the like is formed by CVD method or the like. Then, the insulating film is patterned by a photolithographic technique or the like to form current confined portions 80 at the respective corner areas of the semiconductor layer 12 (FIGS. 9A and 9B).

Figure 9C:
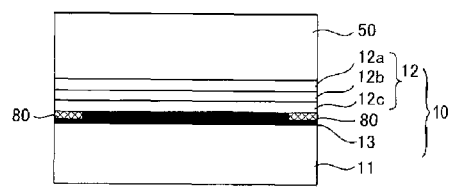

The formed semiconductor layer 12 is bonded to a support substrate 11. The support substrate 11 is a semiconductor substrate such as an Si or Ge substrate opaque with respect to the wavelength of emitted light. The semiconductor layer 12 and the support substrate 11 are bonded together via a metal layer 13. The metal layer 13 is formed by stacking a plurality of metal films including, for example, AuSn soldering materials or the like. At this time, the p-type semiconductor layer 12c on which the current confined portions 80 are formed serves as a bonded surface (FIG. 9C). It should be noted that the current confined portions 80 of the depicted embodiment are formed on the surface of the semiconductor layer 12. Alternatively, however, the current confined portions 80 can be formed on the surface of the support substrate 11 and they may be bonded to the semiconductor layer 12.

Figure 9D:

Then, the sapphire substrate 50 is removed from the semiconductor layer 12. The sapphire substrate 50 can be removed by a known method such as the LLO method or the like. When performing the LLO method, the GaN layer formed on the sapphire substrate 50 is decomposed by the irradiation of laser light into metal Ga and N. After removing the sapphire substrate 50, the n-type semiconductor layer 12a is exposed (FIG. 9D).

Figure 9E:
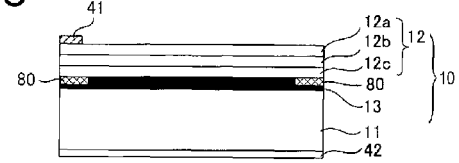
Figure 9F:
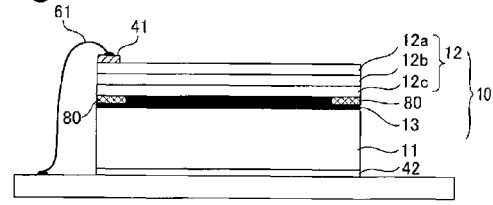

Next, metal such as Au, Ag, Al or the like can be deposited on the n-type semiconductor layer 12a, which has been exposed by the removal of the sapphire substrate 50, by a sputtering method or the like, and the metal is patterned by a photolithography technique or the like, thereby forming an electrode pad 41. Furthermore, a rear electrode 42 is formed by vapor deposition of a metal such as Pt or the like on the surface of the support substrate 11 (FIG. 9E).

Next, the semiconductor light emitting element 10 including the support substrate 11 and the semiconductor layer 12 formed by the above process is diced into individual chips. Then, the diced semiconductor light emitting element 10 is mounted on a mount substrate 60. The semiconductor light emitting element 10 and the mount substrate 60 are bonded together by use of AuSn soldering materials or a conductive adhesive such as Ag paste or the like. Then, the electrode pad 41 formed on the top surface of the semiconductor layer 12 is connected to a power supply wiring formed on the mount substrate 60 by a bonding wire 61 (FIG. 7F).

Figure 9G:
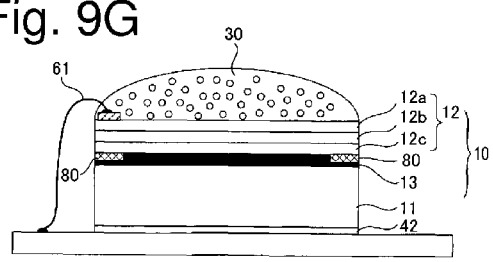

Next, a gel-like wavelength conversion member can be coated on the top surface of the semiconductor layer 12 by a dispenser. The wavelength conversion member can be a material that is prepared by dispersing YAG:Ce phosphor into a transparent resin including an epoxy resin or a silicone resin. The wavelength conversion member can be applied with an adjusted coating amount such that the member does not run over the top surface of the semiconductor layer 12. Then, the wavelength conversion member is cured by heat to form a phosphor-containing layer 30 covering the top surface of the semiconductor layer 12. It should be noted that the phosphor dispersed in the transparent resin may be uniformly distributed or settled in the transparent resin. As a result, the semiconductor light emitting apparatus of the present exemplary embodiment can be completed through the above process (FIG. 9G).

Figure 10:
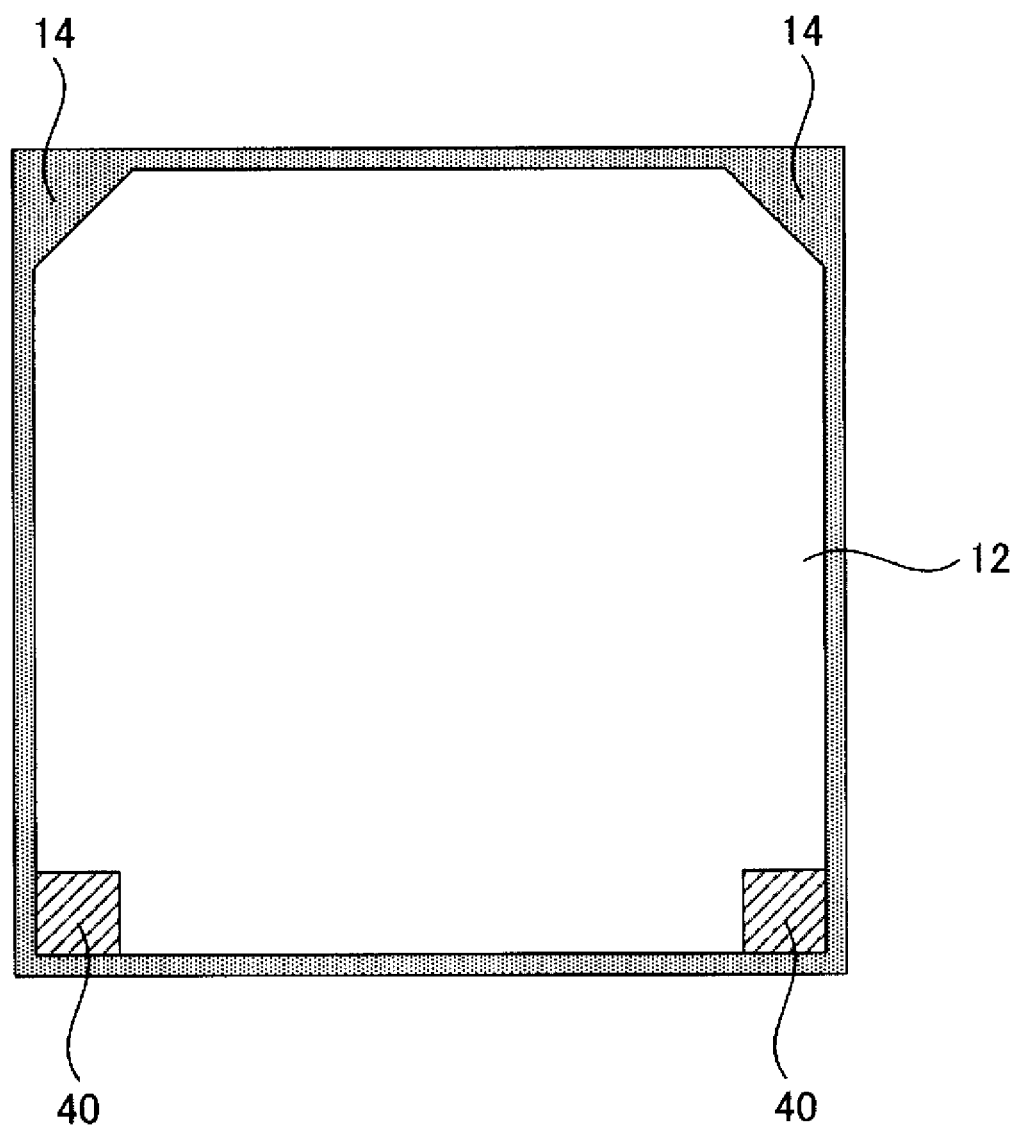
FIG. 10 is a top plan view illustrating a semiconductor light emitting apparatus of another exemplary embodiment made in accordance with principles of the presently disclosed subject matter.

The above described exemplary embodiments can be combined with each other and the sequence of the portions of the process can be rearranged or combined with each other. FIG. 10 is a top plan view of a semiconductor light emitting apparatus in which the light shielding portions of the first exemplary embodiment is combined with the non-light emission portions of the second exemplary embodiment. Note that the phosphor-containing layer is omitted in FIG. 10 for facilitating understanding. As shown, the light shielding portions 40 can be provided at two corner areas of the semiconductor layer 12 and the non-light emission portions 14 can be provided at the other two corner areas thereof. In this configuration, the same or superior effect can be obtained. The light shielding portions 40 formed at two corner areas are composed of a metal film such as Au, Ag, Al or the like metal formed on the surface of the semiconductor layer 12, and serve as an electrode pad. Accordingly, the electrode pad can function as the light shielding portion of the presently disclosed subject matter, thereby minimizing the area occupied by these portions that hinder the light emitting portion. Therefore, the deterioration of light utilization efficiency can be suppressed. In this exemplary embodiment, the non-light emission portions 14 at the other two corner portions are formed by removing the light emitting layer in the shape of a triangle along the corner area. The triangular non-light emission portions 14 can reduce the occupied area on the light emitting portion more than the rectangular non-light emission portion.

In the above exemplary embodiments, the support substrate is an opaque substrate such as an Si or Ge substrate, but the presently disclosed subject matter is not limited thereto. The support substrate can be a transparent sapphire substrate or the like. In this case, the blue light can be emitted from the side surface of the sapphire substrate and this light may cause color unevenness. However, color unevenness can be prevented by thinning the used sapphire substrate or covering the side surface of the sapphire substrate with a high reflectance member or a light shielding member. When such a transparent support substrate is used, the n-type and p-type semiconductor layers can be exposed on the same side. This can result in or at least facilitate a flip chip structure, thereby eliminating the need for wire bonding. When the gel-like wavelength conversion member is coated using a dispenser, the wire should be avoided from contact with the coating. However, when the above configuration (utilizing the transparent support substrate) is employed, this operation is not required, thereby improving the workability.

In any one of the above exemplary embodiments, the non-emitting portions such as the light shielding portions, the non-light emission portions or the current confined portions are formed at all of the corner areas of the semiconductor light emitting element to prevent or solve color unevenness. However, when color unevenness can be adequately prevented or solved by the optical system design, the non-emitting portions may not be required to be provided at all of the corner areas.

In the above exemplary embodiments, the semiconductor light emitting apparatus for emitting white light is obtained by combining the GaN type blue light emitting element and the YAG type yellow phosphor. However, the presently disclosed subject matter is not limited thereto. Examples of other phosphor include orthosilicate, sulfide type phosphor, nitride type phosphor, or the like.

In the above exemplary embodiments, the semiconductor light emitting apparatus has a rectangular semiconductor layer, but the presently disclosed subject matter is not limited thereto. The semiconductor layer can be another shape having at least one corner area (for example, quarter sector shape).

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A semiconductor light emitting apparatus configured to emit light in a light emitting direction, comprising:
 a semiconductor layer having a light emitting layer with a light emitting surface having at least one corner area;
 a supporting substrate configured to support the semiconductor layer; and
 a wavelength conversion layer formed on top of the semiconductor layer, the wavelength conversion layer having a thickness that becomes thinner in the light emitting direction from a center portion of the wavelength conversion layer to an outer peripheral portion of the wavelength conversion layer, wherein
 the at least one corner area includes a non-light-emitting portion where light cannot be projected.

2. The semiconductor light emitting apparatus according to claim 1, wherein the wavelength conversion layer is formed by applying a wavelength conversion member to a top surface of the semiconductor layer, the wavelength conversion member comprising a transparent resin and a phosphor, and the wavelength conversion member being cured.

3. The semiconductor light emitting apparatus according to claim 1, wherein the non-light-emitting portion is composed of a light shielding portion configured to shield light emitted from the light emitting layer.

4. The semiconductor light emitting apparatus according to claim 2, wherein the non-light-emitting portion is composed of a light shielding portion configured to shield light emitted from the light emitting layer.

5. The semiconductor light emitting apparatus according to claim 3, wherein the light shielding portion is composed of a metal film formed on the surface of the semiconductor layer.

6. The semiconductor light emitting apparatus according to claim 4, wherein the light shielding portion is composed of a metal film formed on the surface of the semiconductor layer.

7. The semiconductor light emitting apparatus according to claim 1, wherein the non-light-emitting portion is composed of a portion in which the light emission layer is removed in part.

8. The semiconductor light emitting apparatus according to claim 2, wherein the non-light-emitting portion is composed of a portion in which the light emission layer is removed in part.

9. The semiconductor light emitting apparatus according to claim 1, wherein the non-light-emitting portion is composed of a current confined portion configured to prevent current from flowing through the light emitting layer at the at least one corner area.

10. The semiconductor light emitting apparatus according to claim 2, wherein the non-light-emitting portion is composed of a current confined portion configured to prevent current from flowing through the light emitting layer at the at least one corner area.

11. The semiconductor light emitting apparatus according to claim 9, wherein the current confined portion is composed of an insulation film formed between the support substrate and the semiconductor layer.

12. The semiconductor light emitting apparatus according to claim 10, wherein the current confined portion is composed of an insulation film formed between the support substrate and the semiconductor layer.

13. The semiconductor light emitting apparatus according to claim 1, wherein the non-light-emitting portion is arranged along at least one outer edge portion of the semiconductor layer.

14. The semiconductor light emitting apparatus according to claim 1, wherein the semiconductor layer has a rectangular shape having corner areas, and the non-light-emitting portion is arranged at least one corner area of the semiconductor layer.

15. The semiconductor light emitting apparatus according to claim 1, wherein the support substrate is opaque to light emitted from the light emitting layer.

16. A semiconductor light emitting apparatus configured to emit light in a light emitting direction, comprising:
 a semiconductor layer having a light emitting layer with a light emitting surface having at least one corner area;
 a supporting substrate configured to support the semiconductor layer;
 a wavelength conversion layer formed adjacent the semiconductor layer, the wavelength conversion layer having a thickness in the light emitting direction that is relatively larger at a central portion of the wavelength conversion layer and is relatively thinner at an outer peripheral portion of the wavelength conversion layer; and
 a non-light-emitting portion located at the at least one corner area and from which light is not emitted from the semiconductor light emitting apparatus as viewed from the light emitting direction of the semiconductor light emitting apparatus.

17. The semiconductor light emitting apparatus according to claim 16, wherein the non-light-emitting portion includes a light shielding portion located at the at least one corner area and configured to shield light emitted from the light emitting layer.

18. The semiconductor light emitting apparatus according to claim 17, wherein the light shielding portion includes a metal film formed on the surface of the semiconductor layer.

19. The semiconductor light emitting apparatus according to claim 16, wherein the non-light-emitting portion includes an indented portion of the light emission layer extending into the light emission layer towards a center portion of the light emission layer from the at least one corner area.

20. The semiconductor light emitting apparatus according to claim 16, wherein the non-light-emitting portion includes a current confined portion configured to prevent current from flowing through the light emitting layer at the at least one corner area.

* * * * *